United States Patent [19]

Omote et al.

[11] Patent Number: 5,665,523
[45] Date of Patent: Sep. 9, 1997

[54] HEAT-RESISTANT NEGATIVE PHOTORESIST COMPOSITION, PHOTOSENSITIVE SUBSTRATE, AND PROCESS FOR FORMING NEGATIVE PATTERN

[75] Inventors: Toshihiko Omote; Hirofumi Fujii, both of Osaka, Japan

[73] Assignee: Nitto Denko Corporation, Osaka, Japan

[21] Appl. No.: 751,555

[22] Filed: Nov. 18, 1996

Related U.S. Application Data

[63] Continuation of Ser. No. 411,469, Mar. 28, 1995, abandoned.

[30] Foreign Application Priority Data

Mar. 29, 1994 [JP] Japan ..................... 6-058606

[51] Int. Cl.$^6$ .......................... G03F 7/004; G03F 7/34
[52] U.S. Cl. ...................... 430/282.1; 430/906; 430/920; 430/270.1
[58] Field of Search ............................ 430/270.1, 282.1, 430/906, 920

[56] References Cited

U.S. PATENT DOCUMENTS

| | | | |
|---|---|---|---|
| 3,073,784 | 1/1963 | Endrey | 252/518 |
| 3,179,614 | 4/1965 | Edwards | 260/30.2 |
| 3,179,630 | 4/1965 | Endrey | 260/78 |
| 3,179,631 | 4/1965 | Endrey | 260/78 |
| 4,242,437 | 12/1980 | Rohloff | 430/270 |
| 4,331,705 | 5/1982 | Samudrala | 430/270 X |
| 4,604,340 | 8/1986 | Grossa | 430/270 |
| 5,081,000 | 1/1992 | Kuehn et al. | 430/282 X |

FOREIGN PATENT DOCUMENTS

| | | | |
|---|---|---|---|
| 0388482 | 9/1990 | European Pat. Off. | |
| 0502400 | 9/1992 | European Pat. Off. | |
| 0502400A1 | 9/1992 | European Pat. Off. | 430/282 |
| 0578177 | 12/1994 | European Pat. Off. | |
| 00287796A1 | 9/1989 | Germany | 430/282 |
| 50-40992 | 4/1975 | Japan | |
| 54-145794 | 11/1979 | Japan | |
| 56-38038 | 4/1981 | Japan | |
| 59-108031 | 6/1984 | Japan | |
| 59-219330 | 12/1984 | Japan | |
| 59-220730 | 12/1984 | Japan | |
| 59-232122 | 12/1984 | Japan | |
| 59-231233 | 12/1984 | Japan | |
| 60-6729 | 1/1985 | Japan | |
| 60-72925 | 4/1985 | Japan | |
| 61-57620 | 3/1986 | Japan | |
| 49-11541 | 2/1994 | Japan | |

OTHER PUBLICATIONS

Banba et al, Chem. Abst 117:36596x of European Pat. Application 459, 395, printed Dec. 4, 1991, 26 pp. Abstract printed in vol. 117, in 1992 on p. 711.

Omote et al, Chem. Abst. 120:232094h of Jpn Kokai JP 05-281,717 issued Oct. 29, 1993, 7 pp. Abstract printed 1994, vol. 120, p. 1013.

Yamaoka et al, Chem. Abst. 119:282250f of Jpn Kokai JP 05-11,451 issued Jan. 22, 1993, 8 pp. Abstract Printed 1993 in vol. 119 on p. 827.

T. Yamaoka et al, *Journal of Imaging Science*, vol. 34, No. 2, Mar./Apr. 1990, pp. 50–54.

J.A. Joule et al, Chapter 3, "Pyridines: General Discussion and a Comparison with Benzene", *Heterocyclic Chemistry*, 2nd ed, Van Nostrand Reinhold Co, London, Eng. 1978, pp. 32–43.

*Polymer Preprint Japan*, 39(8), 2397 (1990), pp. 2394–2399.

*Primary Examiner*—Cynthia Hamilton
*Attorney, Agent, or Firm*—Sughrue, Mion, Zinn, Macpeak & Seas

[57] ABSTRACT

A photoresist composition which can form a negative pattern with good heat resistance upon irradiation with actinic rays can be prepared by adding a 4-(2'-nitrophenyl)-1-alkyl (or alkoxyl)-4-dihydropyridine as a photosensitive compound which shows basicity by the irradiation with actinic rays to a resin component comprising a polyimide precursor having a specific structure.

6 Claims, No Drawings

HEAT-RESISTANT NEGATIVE PHOTORESIST COMPOSITION, PHOTOSENSITIVE SUBSTRATE, AND PROCESS FOR FORMING NEGATIVE PATTERN

This is a Continuation of application Ser. No. 08/411,469 filed Mar. 28, 1995 now abandoned.

FIELD OF THE INVENTION

The present invention relates to a heat-resistant negative photoresist composition, a photosensitive substrate and a process for forming a negative pattern.

BACKGROUND OF THE INVENTION

Photosensitive polyimides or precursors thereof which have generally been practically used as ones having heat resistance are mainly of negative type in which irradiation of actinic rays decreases the solubility of the polyimides or the precursors thereof in a developing solution to form intended relief images on various substrates.

Many proposals have been made for heat-resistant photoresists using the negative photosensitive polyimides or the precursors thereof in which the areas irradiated with actinic rays are left on the substrates and for uses thereof. Examples of such proposals include (1) a process of introducing a methacryloyl group into a polyimide precursor via an ester bond or an ionic bond as described in JP-A-49-11541 (The term "JP-A" as used herein means an "unexamined published Japanese patent application"), JP-A-50-40992, JP-A-54-145794, and JP-A-56-38038, (2) soluble polyimides containing a photo-polymerizable olefin as described in JP-A-59-108031, JP-A-59-220730, JP-A-59-232122, JP-A-60-6729, JP-A-60-72925, and JP-A-61-57620, and (3) autosensitization type polyimides containing a benzophenone skeleton and containing alkyl groups at the ortho positions of aromatic rings to which the nitrogen atoms are linked as described in JP-A-59-219330, and JP-A-59-231533.

However, the above-described customary negative photoresists functionally have the disadvantages in resolving power and of reduction in yield on manufacturing in some uses. For example, in the above-described item (1), the ester bond type compounds are difficult to synthesize and the ionic bond type compounds cause shrinkage on heat curing by imidation and film reduction on development as well, so that, after development and heat curing, the thickness of the residual film is about 50% of the original one, thereby encountering a problem in dimensional stability. Further, in the above-described items (2) and (3), limitation of the polymers in skeletal structure restricts physical properties of the films finally obtained, which are unable to flexibly meet various properties required, resulting in being unsuited for multiple application.

A photosensitive material prepared by mixing a polyimide precursor with N-methylolacrylamide has also been reported in *Polymer Preprint Japan*, 39(8), 2397 (1990). However, since the percentage of the residual film thickness is 50%, it has a disadvantage in dimensional stability, and also has a disadvantage of requiring a prolonged prebake.

SUMMARY OF THE INVENTION

An object of the present invention is to solve the problems which the negative photoresists have hitherto encountered to provide a heat-resistant negative photoresist composition in which a precursor of polyamide which is a resin for imparting heat resistance as a resist-forming material, is not relatively limited in structure, and which is excellent in sensitivity and resolving power and can be adapted to a practical manufacturing process.

Another object of the present invention is to provide a photosensitive substrate prepared by using the above-described heat-resistant negative photoresist composition and a process of forming a negative pattern.

DETAILED DESCRIPTION OF THE INVENTION

As a result of intensive studies about the above-described negative photoresist compositions, the present inventors have discovered that a negative photoresist composition capable of achieving the above-described objects is obtained by adding a specific compound showing basicity upon irradiation with actinic rays to a resin component comprising a polyimide precursor, thus completing the present invention.

That is, the present invention provides a heat-resistant negative photoresist composition comprising a resin component containing a structural unit represented by formula (I):

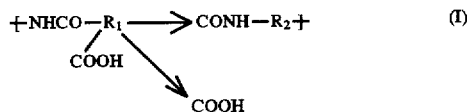

wherein the arrows each indicates a bond which can be substituted by isomerization, $R_1$ represents a tetravalent aromatic or aliphatic hydrocarbon residue, and $R_2$ represents a divalent aromatic or aliphatic hydrocarbon residue, and a compound represented by formula (II) which shows basicity upon irradiation with actinic rays:

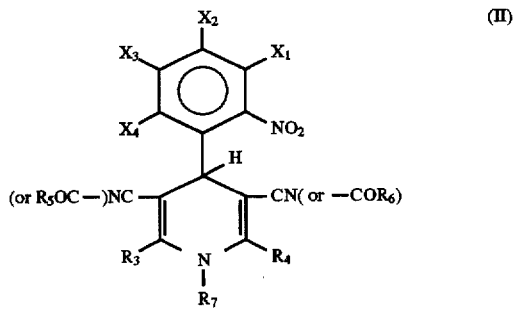

wherein $R_3$ and $R_4$ each represents a hydrogen atom or an alkyl group containing 1 to 3 carbon atoms, $R_5$ and $R_6$ each is one selected from the group consisting of an alkyl group containing 1 to 4 carbon atoms, an alkoxyl group containing 1 to 4 carbon atoms, an anilino group, a toluidino group, a benzyloxy group, an unsubstituted amino group and a dialkylamino group, $R_7$ is an alkyl group containing 1 to 3 carbon atoms, an alkoxyl group containing 1 to 3 carbon atoms or an alkoxyalkyl group, and $X_1$ to $X_4$ each is one selected from the group consisting of a hydrogen atom, a fluorine atom, a nitro group, a methoxy group, a dialkylamino group, an unsubstituted amino group, a cyano group and a fluorinated alkyl group. The compound of formula (II) has —CN or —COR$_5$ at the 3-position and —CN or —COR$_6$ at the 5-position of the pyridine ring as shown in the above formula.

The dialkylamino group of $R_5$ or $R_6$ preferably has two alkyl groups each having 1 to 4 carbon atoms. The alkoxyalkyl group of $R_7$ preferably has an alkoxy group and an alkyl group each having 1 to 4 carbon atoms. The dialkylamino group of $X_1$ to $X_4$ preferably has two alkyl groups each having 1 to 4 carbon atoms. The fluorinated alkyl group of $X_1$ to $X_4$ preferably has an alkyl group having 1 to 2 carbon atoms.

Further, the present invention provides a photosensitive substrate which is prepared by applying the above-described heat-resistant negative photoresist composition to a surface of a substrate.

Furthermore, the present invention provides a process of forming a negative pattern comprising irradiating a film obtained from the heat-resistant negative photoresist composition with actinic rays through a photomask, heat treating the film, and then removing the unexposed areas by a basic developing solution.

The resin component used in the heat-resistant negative photoresist composition of the present invention, which act as a skeletal material for forming the resist, is a polyimide precursor having the structural unit represented by formula (I). Non-limiting examples of $R_1$ in the structural unit represented by formula (I) include a tetravalent aromatic or aliphatic hydrocarbon residue containing a skeleton such as benzene, naphthalene, perylene, diphenyl, diphenyl ether, diphenyl sulfone, diphenylpropane, diphenylhexafluoropropane, benzophenone, butane, and cyclobutane. Preferred examples thereof are benzene, diphenyl and benzophenone. $R_1$ may contain two or more kinds of the skeletons exemplified above.

$R_1$ may contain the above-mentioned skeleton which has a substituent(s) such as —$CH_3$, —$CF_3$, —$C_2H_5$, or a halogen atom (e.g., fluorine). It is preferred that $R_1$ has 4 to 24 carbon atoms.

Non-limiting examples of $R_2$ include a divalent aromatic or aliphatic hydrocarbon residue containing a skeleton such as diphenyl ether, diphenyl thioether, benzophenone, diphenylmethane, diphenylpropane, diphenylhexafluoropropane, diphenyl sulfoxide, diphenyl sulfone, diphenyl, pyridine, and benzene. Preferred examples thereof are diphenyl ether, diphenyl sulfone and benzene. $R_2$ may contain two or more kinds of the skeletons exemplified above.

$R_2$ may contain the above-mentioned skeleton which has a substituent(s) such as an alkyl group or carbon fluoride each having 1 to 3 carbon atoms (e.g., —$CH_3$ or —$CF_3$), —$OCH_3$, or a halogen atom (e.g., Br, Cl, or F). It is preferred that $R_2$ has 4 to 36 carbon atoms.

The resin component containing such structural units can be prepared by, for example, reacting approximately equimolar amounts of an aromatic or aliphatic tetracarboxylic acid dianhydride containing the group of $R_1$ in the molecule and an aromatic or aliphatic diamine containing the group of $R_2$ in the molecule in an organic solvent such as N-methyl-2-pyrrolidone, dimethylacetamide, dimethylformamide, dimethyl sulfoxide, and hexamethyl phosphorylamide.

The polyimide precursor which can be used in the present invention has generally a weight-average molecular weight of from 30,000 to 200,000, preferably from 40,000 to 80,000, as a value reduced to polystyrene as a standard substance, which can be measured by gel permeation chromatography (GPC).

The heat-resistant negative photoresist compositions of the present invention can be prepared by adding a photosensitive compound represented by formula (II) to a resin component having the structural unit represented by formula (I). That is, the photosensitive compound represented by formula (II) which shows basicity upon irradiation with actinic rays is included in the composition and, if desired, in combination with a known sensitizer. The photosensitive compound represented by formula (II) is used generally in an amount of from 5 to 50 parts by weight, preferably from 10 to 40 parts by weight, per 100 parts by weight of the resin component represented by formula (I). If the amount of the photosensitive compound added is too small, dissolution inhibition ability of the exposed areas deteriorates and, hence, poor solubility contrast is apt to result. If the amount thereof is too large, the composition may show poor stability during storage in solution to develop a solid precipitate, which not only adversely affects pattern-forming properties but also leads to a considerable decrease in the film thickness upon heat treatment after the formation of a negative pattern, resulting in poor mechanical strength.

In the present invention, the compound of formula (II) is presumed to function as follows. When irradiated with an actinic ray, the compound undergoes intramolecular rearrangement to change its structure to a structure containing a pyridine skeleton and to become basic. Thereafter, a chemical reaction proceeds upon subsequent heat treatment to cause some interaction either between the resulting basic compound and the resin component having a structural unit represented by formula (I) or within the basic compound. As a result, the resulting composition has reduced alkali solubility and hence can form a good negative pattern.

In the compounds represented by formula (II), preferred $R_3$ and $R_4$ thereof each are an alkyl group, particularly a methyl group; preferred $R_5$ and $R_6$ each are an alkyl group, particularly a methyl group; and particularly preferred $X_1$ to $X_4$ each are a hydrogen atom. Preferred examples of the compounds represented by formula (II) include compounds containing an alkyl group, particularly a methyl group, at the 1-position of the pyridine ring (i.e., $R_7$ in formula (II)), such as 2,6-dimethyl-3,5-dicyano-4-(2'-nitrophenyl)-1-methyl-4-dihydropyridine, 2,6-dimethyl-3,5-diacetyl-4-(2'-nitrophenyl)-1-methyl-4-dihydropyridine, or 2,6-dimethyl-3,5-diacetyl-4-(2',4'-dinitrophenyl)-1-methyl-4-dihydropyridine. Besides, compounds containing an alkoxyl group or an alkoxyalkyl group at the 1-position of the pyridine ring may be used.

The compounds represented by formula (II) can be prepared, for example, by reacting a substituted benzaldehyde and aminocrotonitrile at a molar ratio of 1:2 in glacial acetic acid under reflux; by reacting a substituted benzaldehyde, acetylacetone, and ammonia at a molar ratio of 1:2:1 in methanol; or by alkylation of a corresponding 1,4-dihydropyridine derivative prepared according to a general synthetic process thereof as described in J. Chem. Soc., 1931, 1835 (1931) with an alkyl iodide and the like.

A process of forming an image using the heat-resistant negative photoresist composition of the present invention will be illustrated as an example below.

First, a resin component represented by formula (I) and a compound represented by formula (II) are dissolved in an organic solvent to prepare a photosensitive solution. Examples of the organic solvent include N-methyl-2-pyrrolidone, dimethylacetamide, dimethylformamide, dimethyl sulfoxide, and hexamethyl phosphorylamide. Second, this photosensitive solution is applied to a substrate so that the dried film may be generally from 1 to 30 μm, and preferably from 10 to 20μm, in thickness. Examples of the substrate include silicon wafer, metal plate, metal foil, and ceramics plate.

After drying (80° C., about 10 minutes), the coated film is subjected to exposure through an ordinary photomask, to post-heat treatment (150° to 200° C., and preferably 170° C. or higher, about 10 minutes), and then to development by a dipping process or a spray process to remove the unexposed areas from the film. Preferred developing solutions used for the purpose are those which can thoroughly dissolve and remove the unexposed areas of the film within a suitable period of time. Examples thereof include an aqueous solution of an inorganic alkali such as sodium hydroxide and potassium hydroxide and an aqueous solution of organic alkali such as propylamine, butylamine, monoethanolamine, tetramethylammonium hydroxide and choline. The aqueous alkaline solution may be used singly or as a mixture of two or more kinds thereof. Further, the aqueous alkaline solution may include an organic solvent such as alcohols and various kinds of a surfactant.

After development, the film is washed with a rinsing solution to form a resin image having a desired negative pattern.

The image thus formed is finally heat-treated at a high temperature (about 200° to about 450° C.) so that the polyimide precursor may be subjected to dehydration and ring closure to form the imide, thus obtaining a heat-resistant polyimide image.

The present invention will be illustrated in more detail with reference to examples below.

EXAMPLE 1

Approximately equimolar amounts of biphenyltetracarboxylic acid dianhydride and p-phenylenediamine were reacted in a monomer concentration (the total concentration of the two monomers) of 20% by weight in dimethylacetamide at room temperature for 24 hours to obtain a solution of a polyimide precursor represented by formula (I).

To the solution thus obtained, there were added 10 parts by weight of a compound represented by formula (II) wherein $R_3$ and $R_4$ each were a methyl group; $X_1$, $X_2$, $X_3$, and $X_4$ each were a hydrogen atom; and $R_5$, $R_6$ and $R_7$ each were a methyl group (hereinafter abbreviated as "o-NAC (M)") per 100 parts by weight of the solid in the solution of a polyimide precursor, and uniformly dissolved.

A silicon wafer was spin coated with this solution using a spin coater at a revolution of 2,200 rpm for 20 seconds, and predried on a hot plate of 80° C. for 10 minutes to form a dried film of about 3 µm in thickness. The film was then subjected to vacuum contact exposure through a glass mask for 3 minutes at a distance of 30 cm from a light source, a 250-W ultra-high pressure mercury vapor lamp.

After exposure, the wafer was heat treated on a hot plate at 160° C. for 3 minutes, developed with a mixture comprising a mixture (3:1 by volume) of an aqueous solution of tetramethylammonium hydroxide (concentration; 5% by weight) and ethanol at 35° C. for 1 minute, and rinsed with water to clearly leave only the exposed areas on the substrate, thus obtaining a negative pattern with a resolving power of 10 µm in line and space.

The percentage of residual film thickness of this pattern was about 70%, which was obtained according to the following equation:

The percentage of residual film thickness (%)=(film thickness of unexposed area after development/film thickness of unexposed area before development)×100.

With heat treatment at a high temperature (400° C., 2 hours), the residual film was easily subjected to imidation.

EXAMPLE 2

A negative pattern was formed in the same manner as in Example 1, except that a compound wherein $R_5$ and $R_6$ each were a methoxy group (hereinafter abbreviated as "o-NME (M)") was used in place of the o-NAC(M) and that the heat treatment on a hot plate after exposure was conducted at 150° C. for 10 minutes.

As a result, only the exposed areas were clearly left on the substrate to give a negative pattern with a resolving power of 5 µm in line and space.

The percentage of residual film thickness of this pattern was about 80%.

With heat treatment at a high temperature (400° C., 2 hours), the residual film was easily subjected to imidation.

EXAMPLE 3

A negative pattern was formed in the same manner as in Example 2, except that a polyamido acid was prepared as a polyimide precursor from biphenyltetracarboxylic acid dianhydride and 3,3'-diaminodiphenyl sulfone.

As a result, only the exposed areas were clearly left on the substrate to give a negative pattern with a resolving power of 3 µm in line and space.

The percentage of residual film thickness of this pattern was about 85%.

With heat treatment at a high temperature (400° C., 2 hours), the residual film was easily subjected to imidation.

COMPARATIVE EXAMPLE 1

Formation of a pattern was conducted by use of nifedipine wherein $R_7$ is a hydrogen atom in place of o-NME(M) employed in Example 2.

As a result, although a negative pattern clearly leaving only the exposed areas on the substrate could be obtained, the percentage of residual film thickness after development was about 40% because of a relatively lower heat temperature of 150° C. after exposure, failing to obtain a pattern having a similar high resolving power to those of the above-described examples.

These results show that the heat-resistant negative photoresist composition of the present invention makes it possible to form a negative pattern with high sensitivity and high resolving power by utilizing a larger difference of the dissolving rate to an alkaline developing solution between the exposed areas and unexposed areas wherein the exposed areas decrease the alkali solubility by irradiation with actinic rays comprising the wavelengths that a specific photosensitive compound contained in the composition mainly absorbs.

Further, formation of a desired pattern can be conducted relatively simply and inexpensively, and the products of high quality can be supplied. Furthermore, the final products which are obtained by the heat treatment at a high temperature are excellent in heat resistance, electric characteristics and mechanical characteristics. This composition is suitable as a material for forming a solid state component, protective film and insulating film for circuit boards in the semiconductor industry.

While the invention has been described in detail and with reference to specific examples thereof, it will be apparent to one skilled in the art that various changes and modifications can be made therein without departing from the spirit and scope thereof.

What is claimed is:

1. A heat-resistant negative photoresist composition consisting essentially of a resin component containing a structural unit represented by formula (I):

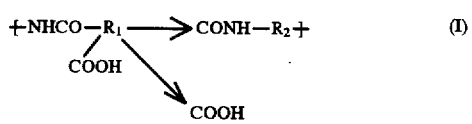

(I)

wherein the arrows each indicates a bond which can be substituted by isomerization, $R_1$ represents a tetravalent aromatic or aliphatic hydrocarbon residue, and $R_2$ represents a divalent aromatic or aliphatic hydrocarbon residue, and a compound represented by formula (II) which shows basicity upon irradiation with actinic rays:

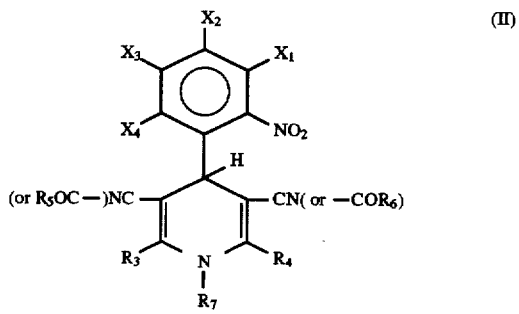

(II)

wherein $R_3$ and $R_4$ each represents a hydrogen atom or an alkyl group containing 1 to 3 carbon atoms, $R_5$ and $R_6$ each is one selected from the group consisting of an alkyl group containing 1 to 4 carbon atoms, an alkoxyl group containing 1 to 4 carbon atoms, an anilino group, a toluidino group, a benzyloxy group, an unsubstituted amino group and a dialkylamino group, $R_7$ is an alkyl group containing 1 to 3 carbon atoms, an alkoxyl group containing 1 to 3 carbon atoms or an alkoxyalkyl group, and $X_1$ to $X_4$ each is one selected from the group consisting of a hydrogen atom, a fluorine atom, a nitro group, a methoxy group, a dialkylamino group, an unsubstituted amino group, a cyano group and a fluorinated alkyl group.

2. The heat-resistant negative photoresist composition of claim 1, wherein $R_1$ is a tetravalent aromatic or aliphatic hydrocarbon residue containing at least one skeleton selected from the group consisting of benzene, naphthalene, perylene, diphenyl, diphenyl ether, diphenyl sulfone, diphenylpropane, diphenylhexafluoropropane, benzophenone, butane and cyclobutane.

3. The heat-resistant negative photoresist composition of claim 1, wherein $R_2$ is a divalent aromatic or aliphatic hydrocarbon residue containing at least one skeleton selected from the group consisting of diphenyl ether, diphenyl thioether, benzophenone, diphenylmethane, diphenylpropane, diphenylhexafluoropropane, diphenyl sulfoxide, diphenyl sulfone, diphenyl, pyridine and benzene.

4. The heat-resistant negative photoresist composition of claim 1, wherein $R_3$ and $R_4$ each is an alkyl group containing 1 to 3 carbon atoms, $R_5$ and $R_6$ each is an alkyl group containing 1 to 4 carbon atoms, $R_7$ is an alkyl group containing 1 to 3 carbon atoms, and $X_1$ to $X_4$ each is a hydrogen atom.

5. The heat-resistant negative photoresist composition of claim 1, wherein the ratio by weight of the resin component to the compound of formula (II) is 100:5 to 50.

6. A photosensitive substrate comprising a substrate having coated on the surface of the substrate a heat-resistant negative photoresist composition consisting essentially of a resin component containing a structural unit represented by formula (I):

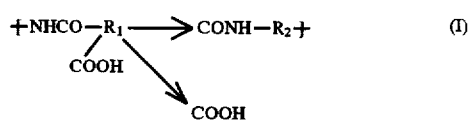

(I)

wherein the arrows each indicates a bond which can be substituted by isomerization, $R_1$ represents a tetravalent aromatic or aliphatic hydrocarbon residue, and $R_2$ represents a divalent aromatic or aliphatic hydrocarbon residue, and a compound represented by formula (II) which shows basicity upon irradiation with actinic rays:

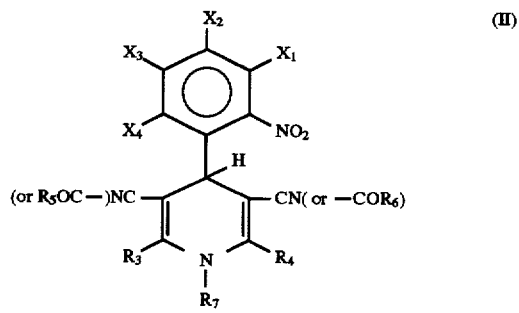

(II)

wherein $R_3$ and $R_4$ each represents a hydrogen atom or an alkyl group containing 1 to 3 carbon atoms, $R_5$ and $R_6$ each is one selected from the group consisting of an alkyl group containing 1 to 4 carbon atoms, an alkoxyl group containing 1 to 4 carbon atoms, an anilino group, a toluidino group, a benzyloxy group, an unsubstituted amino group and a dialkylamino group, $R_7$ is an alkyl group containing 1 to 3 carbon atoms, an alkoxyl group containing 1 to 3 carbon atoms or an alkoxyalkyl group, and $X_1$ to $X_4$ each is one selected from the group consisting of a hydrogen atom, a fluorine atom, a nitro group, a methoxy group, a dialkylamino group, an unsubstituted amino group, a cyano group and a fluorinated alkyl group.

* * * * *